United States Patent [19]

Eu

[11] Patent Number: 5,404,388
[45] Date of Patent: Apr. 4, 1995

[54] DIGITAL MEASUREMENT OF AMPLITUDE AND PHASE OF A SINUSOIDAL SIGNAL AND DETECTION OF LOAD COIL BASED ON SAID MEASUREMENT

[75] Inventor: Jai H. Eu, Raleigh, N.C.

[73] Assignee: Northern Telecom Limited, Montreal, Canada

[21] Appl. No.: 25,565

[22] Filed: Mar. 3, 1993

[51] Int. Cl.⁶ .................. H04M 1/24; H04M 3/22
[52] U.S. Cl. ................................. 379/24; 379/1; 379/27; 379/29; 379/30
[58] Field of Search ............... 379/1, 22, 24, 27, 29, 379/30, 33

[56] References Cited

U.S. PATENT DOCUMENTS

| | | | |
|---|---|---|---|
| 4,307,267 | 12/1981 | Peoples | 179/175.3 R |
| 4,350,849 | 9/1982 | Ahiya | 379/30 |
| 4,443,662 | 4/1984 | Nakhla | 379/30 |
| 4,486,627 | 12/1984 | Beeman et al. | 179/175.3 R |
| 4,620,069 | 10/1986 | Godwin et al. | 179/175.3 R |
| 4,845,737 | 7/1989 | Ohlendorf | 379/30 |
| 4,852,145 | 7/1989 | Bevers et al. | 379/27 |
| 4,853,950 | 8/1989 | Crane | 379/24 |
| 4,870,675 | 9/1989 | Fuller et al. | 379/27 |
| 4,882,742 | 11/1989 | Kaiser | 379/30 |
| 5,073,920 | 12/1991 | Masukawa | 379/30 |
| 5,142,560 | 8/1992 | Neer | 379/30 |

OTHER PUBLICATIONS

Ibrahim et al., "A Novel Digital Phase Meter," *IEEE Transactions on Instrumentation and Measurement*, vol. IM-36, No. 3, Sep. 1987, pp. 711-716.

Micheletti, "Phase Angle Measurement Between Two Sinusoidal Signals," *IEEE Transactions on Instrumentation and Measurement*, vol. 40, No. 1, Feb. 1991, pp. 40-42.

"Derivation of the Three Parameter (Known Frequency) Sine-Wave Curvefit Algorithm," Appendix to IEEE Standard 1057, pp. 33-34.

Mahmud et al, "A Microprocessor-Based Dual Slope Phase Meter," *IEEE Transactions on Instruments and Measurement*, vol. 37, No. 3, Sep. 1988, pp. 374-378.

Wagdy et al., "Errors in Sampled Data Phase Measurement," *IEEE Transactions on Instrumentation and Measurement*, vol. IM-34, No. 4, Dec. 1985, pp. 507-509.

*Primary Examiner*—Stephen Chin
*Assistant Examiner*—Vijay Shankar
*Attorney, Agent, or Firm*—Lardner & Foley

[57] ABSTRACT

In digital measurement of the amplitude and phase of a sinusoidal signal of known frequency by the least square error method, the sampling frequency and sample size are carefully selected to satisfy a certain relationship. Under these conditions, the measurements are simplified and accuracy improved. This technique of measuring a sinusoidal signal is applied to the detection of a load coil in a telephone subscriber's loop circuit. The magnitude and phase of the driving point impedance of the loop are measured through the use of a series of discrete sinusoidal stimulus signals of predetermined frequencies and a digital signal processing technique.

6 Claims, 2 Drawing Sheets

DIGITAL MEASUREMENT OF AMPLITUDE AND PHASE OF A SINUSOIDAL SIGNAL AND DETECTION OF LOAD COIL BASED ON SAID MEASUREMENT

FIELD OF THE INVENTION

The present invention relates generally to measuring techniques of the magnitude and phase of a sinusoidal signal. In particular the present invention is directed, in one aspect, to a digital measurement technique of the magnitude and phase using a modified least square error method, and in a further aspect the technique is applied to the detection of load coils in a telephone subscriber's loop circuit.

BACKGROUND OF THE INVENTION

The amplitude (magnitude) A (A>0) and phase $\phi$ of the sinusoidal signal X(t) of the form $$X(t) = A \sin(\omega t + \phi)$$

where $\omega$ is a known angular frequency in radian per second, are important parameters to measure in many practical measurement and control applications in the power system or the like. Many methods have been proposed for the purpose and include the zero-crossing detection (ZCD) method, the discrete Fourier transform (DFT) method, and the least square error method (LSM). The zero-crossing detection method transforms the signals into two square waves, and then measures the time difference between the zero-crossings of the two square waves which is proportional to the phase. This method suffers from phase errors clue to the hysteresis and different signal amplitudes. An article entitled "A Novel Digital Phase Meter" by Ibrahim et al in IEEE Transactions on Instrumentation and Measurement, Vol. IM-36, pp 711–716, September 1987, describes such a measurement.

The discrete Fourier transform method performs the DFT on N digitized samples of the signal X(t) which are sampled uniformly at a higher rate than the Nyquist sampling rate. The signal X(t) is converted into a causal discrete-time sinusoidal signal x(n)

$$x(n) = A \sin(\omega n T + \phi) \text{ for } n = 0, 1, 2, \ldots \quad (1)$$

where T is a sampling period in seconds. Subsequently the DFT coefficient is obtained and using this coefficient the amplitude and phase of the signal are calculated. The method however suffers the effect of spectral leakage from the edge discontinuities arising from the beginning and ending of the samples.

In an article entitled "Phase Angle Measurement Between Two Sinusoidal Signals" by R. Micheletti in IEEE Transactions on Instrumentation and Measurement, Vol. 40, No. 1, pp 40–42, February 1991, a new algorithm for measurement of phase angle is described to be based on the least square error method (LSM). The algorithm processes digitized samples of two input signals to calculate the phase angle between them. The algorithm is a general form of measuring technique and uses any arbitrary discrete sampling frequencies and sample sizes. Computation is quite complicated.

The present invention is a new modified LSM of measuring the magnitude and/or phase angle of a sinusoidal signal. Within a wide variety of possible applications, the present disclosure describes embodiments wherein the novel method is implemented in the telephone environment.

In the field of telecommunications, a telephone subscriber's loop may contain one or more load coils which compensate capacitive and inductive impedance matching to improve frequency response for analog telephone signals. Digital services such as Integrated Services Digital Network (ISDN), Digital Subscriber Line (DSL), Asymmetric Digital Subscriber Line (ADSL) and High-bit rate Digital Subscriber Line (HDSL) require much higher bandwidth than the analog plain old telephone service (POTS) does and since load coils behave like a low pass filter with a cutoff frequency of about 4 kHZ, they are an impediment to delivery of these digital services. U.S. Pat. No. 4,486,627 issued Dec. 4, 1984 (Beeman et al) describes an arrangement for monitoring the admittance of a line during a frequency sweep. The characteristic admittance level determines the loaded or unloaded status of a transmission line. Output logic associated with detection circuits provides a digital indication of the status detected. U.S. Pat. No. 4,620,069 issued Oct. 28, 1986 (Godwin et al), on the other hand, teaches techniques for measuring the loop impedance at either one frequency or a plurality of frequencies. Changes in either the real part of the impedance or the phase angle are used to determine the loaded condition of the subscriber's loop. Godwin et al describe two methods of measuring the impedance. One method is simply to connect an analog stimulus signal to the loop and measure by analog signal processing the real part and/or the phase angle of the impedance. Another method involves the use of line circuits provided at a central office digital switch. The digital switch uses codes and therefore this is a digital measurement of the impedance. The method also uses Digital Fourier Transform for calculating magnitude and the phase angle of the impedance.

The prior art techniques for load coil detection suffer from inaccurate measurement, cumbersome procedure, slow response, etc.

OBJECTS OF THE INVENTION

It is therefore an object of the present invention to provide a method and apparatus for measuring the amplitude and/or phase of a sinusoidal signal.

It is another object of the present invention to provide a method and apparatus for measuring the amplitude and/or phase of a sinusoidal signal by using the least square error technique.

It is a further object of the present invention to provide a method and apparatus for detecting load coils in a telephone subscriber's loop circuit.

SUMMARY OF THE INVENTION

Briefly stated, one aspect of the present invention is directed to a method of digitally measuring the amplitude A and/or phase angle $\phi$ of a sinusoidal signal X(t) = A $\sin(\omega t + \phi)$, where t is time and $\omega$ is a known frequency. The method comprises steps of digitizing the sinusoidal signal to generate digitized sample signals s(n), n = 0, 1, 2, . . . , by using the sampling period $T = 2\pi/\omega_s$ and the sample size N = kM where $\omega_s$ is the sampling frequency, k is a positive integer and M is the fundamental period of $\sin(2\omega T)$. The method further includes steps of multiplying the digitized sample signals by $\sin(\omega nT)$ and $\cos(\omega nt)$ and processing all the multiplied signals to generate the amplitude A and/or phase angle $\phi$.

In accordance with another aspect, the present invention is directed to a method of measuring driving point impedances $Z_{tr}$, $Z_{tg}$ and $Z_{rg}$ of a telephone subscriber's loop, where $Z_{tr}$, $Z_{tg}$ and $Z_{rg}$ are respectively the driving point impedance between the tip and ring, between the tip and ground, and between the ring and ground. The method comprises steps of simultaneously applying to the tip and ring of the loop a sinusoidal stimulus signal of a predetermined frequency $\omega$, and measuring the sinusoidal signal which is transmitted through the tip and ring to generate a first pair of respective measured signals. The method has further steps of digitizing the pair of measured sinusoidal signals to generate a first pair of respective digitized sample signals $s_{t1}(n)$ and $s_{r1}(n)$, where $n = 0, 1, 2, \ldots$, by using the sampling period $T = 2\pi/\omega_s$ and the sample size $N = kM$ where $\omega_s$ is the sampling frequency, k is a positive integer and M is the fundamental period of $\sin(2\omega nT)$ and multiplying said $s_{t1}(n)$ and $s_{r1}(n)$ by $\sin(\omega nT)$ and $\cos(\omega nT)$. The method includes more steps of applying to either the tip or ring the sinusoidal stimulus signal of the predetermined frequency and measuring sinusoidal signals which are transmitted through the tip and ring to generate a second pair of respective measured signals. The method has steps of digitizing the second pair of the measured sinusoidal signals to generate a second pair of digitized sample signals $s_{t2}(n)$ and $s_{r2}(n)$, where $n = 0, 1, 2, \ldots$, by using the sampling period $T = 2\pi/\omega_s$ and the sample size $N = kM$ and multiplying the $s_{t2}(n)$, and $s_{r2}(n)$ by $\sin(\omega nT)$ and $\cos(\omega nT)$. Finally the method concludes with a step of processing all the multiplied signals obtained thus far to derive the driving point impedances $Z_{tr}$, $Z_{tg}$ and $Z_{rg}$ of the loop.

In accordance with a yet another aspect, the present invention is directed to an apparatus for detecting the presence of a load coil on a telephone subscriber's loop by measuring driving point impedances thereof. The apparatus comprises a sinusoidal signal generator for generating a plurality of sinusoidal stimulus signals of predetermined discrete frequencies, $\omega_i$, $i = 1, 2, 3 \ldots, m$, to be applied to the tip and ring of the loop and measuring means for measuring separately the currents which flow through the tip and ring to generate respective measured sinusoidal signals. The apparatus further includes digitizing means for digitizing the measured sinusoidal signals to generate respective digitized sample signals $s_{ti}(n)$ and $s_{ri}(n)$, where $n = 0, 1, 2, \ldots$ and $i = 1, 2, 3, \ldots, m$, by using the sampling period $T = 2\pi/\omega_s$ and the sample size $N = kM$ where $\omega_s$ is the sampling frequency, k is a positive integer and M is the fundamental period of $\sin(2\omega nT)$, and processing means for processing the sample signals $s_{ti}(n)$, and $s_{ri}(n)$ to derive the driving point impedances of said loop for each of said series of discrete sinusoidal stimulus signals.

BRIEF DESCRIPTION OF THE DRAWINGS

For a more complete understanding of the present invention and for further objects and advantages thereof, reference may now be made to the following description, taken in conjunction with the accompanying drawings, in which.

DETAILED DESCRIPTION OF THE PREFERRED EMBODIMENTS

Figure 1:
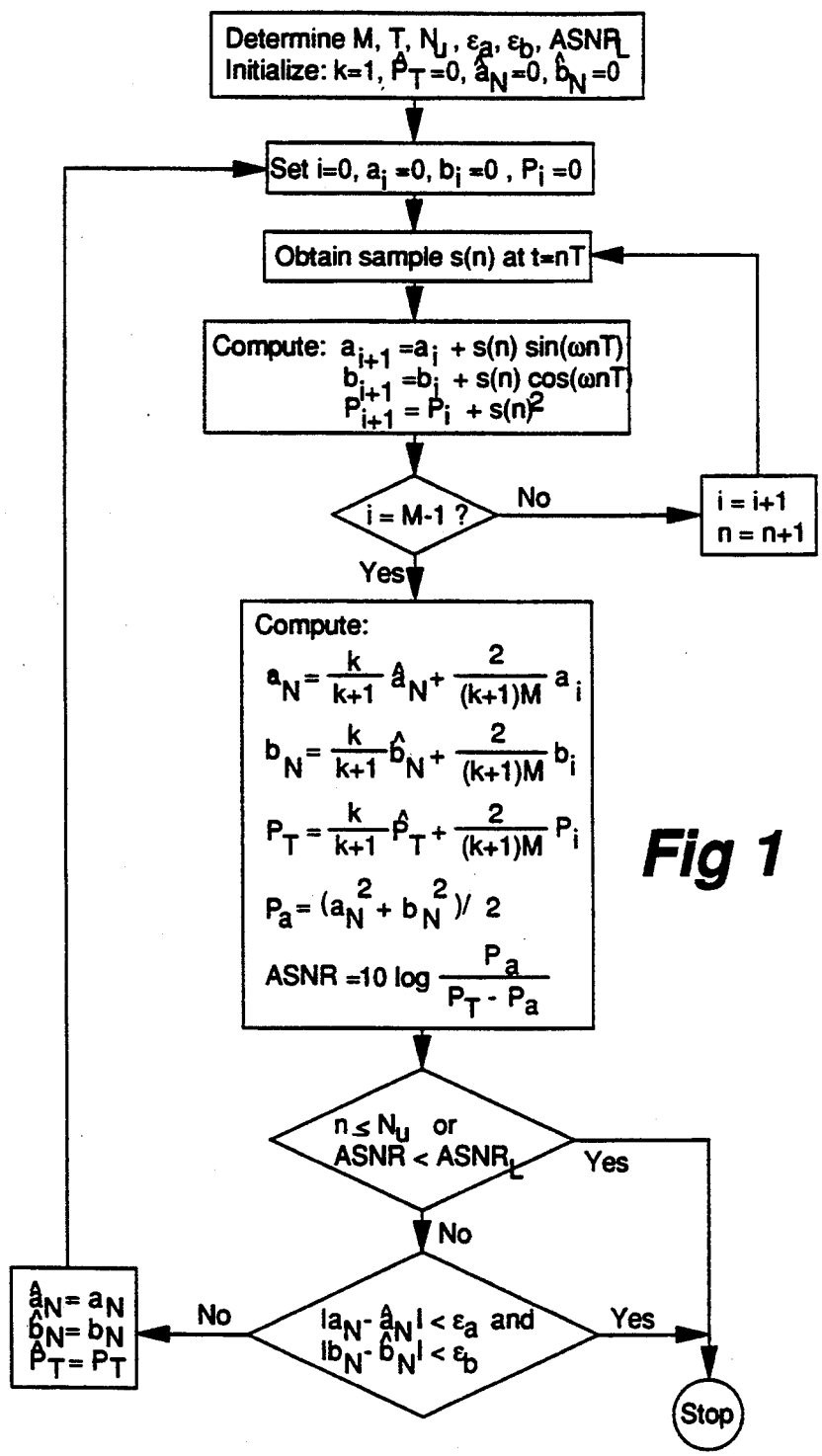
FIG. 1 is a flow chart of a digital phase measurement according to one embodiment of the present invention.

Like the DFT method mentioned above, the LSM approach uses N digitized samples of X(t) to calculate the amplitude and phase of the signal. The equation (1) above can be expressed as a linear combination of $\sin(\omega nT)$ and $\cos(\omega nT)$ as follows:

$$x(n) = a \sin(\omega nT) + b \cos(\omega nT) \quad (2)$$

where $a = A\cos\phi$ and $b = A\sin\phi$. Then the amplitude A and the phase $\phi$ are obtained as follows:

$$A = (a^2 + b^2)^{\frac{1}{2}} \quad (3)$$

$$\phi = \tan^{-1}(b/a) + (1 - sgn(a))\pi \quad (4)$$

In digital processing, the respective estimates of the coefficients a and b are obtained by solving the following least square error problem:

$$\underset{a, b}{\text{Minimize }} \epsilon(a, b) = \frac{1}{N} \sum_{n=0}^{N-1} (s(n) - x(n))^2 \quad (5)$$

$$= \frac{1}{N} \sum_{n=0}^{N-1} (s(n) - a \sin(\omega nT) - b \cos(\omega nT))^2$$

where s(n) is a digitized sample taken at nT.

The explicit form of a unique solution to the above equation is available in "Derivation of the Three Parameters (Known Frequency) Sine-Wave Curvefit Algorithm", IEEE Standard 1057, Appendix A, pp 33–34, July 1989. Furthermore, the above-mentioned article by Micheletti describes a performance comparison of the LSM and DFT methods through the use of computer simulation and shows that the two methods have produced almost identical results even in noisy environments.

As will be described below, the present invention provides a novel and very simplified solution to the least square error problem by selecting a suitable sample size and sampling frequency.

First, as is well known, the optimal solutions $(a_N, b_N)$ to equation (5) of the least square error problem are as follows:

$$a_N = \frac{\alpha_N \sum_{n=0}^{N-1} s(n) \sin(\omega nT) - \gamma_N \sum_{n=0}^{N-1} s(n) \cos(\omega nT)}{\alpha_N \beta_N - \beta_N^2} \quad (6)$$

$$b_N = \frac{\beta_N \sum_{n=0}^{N-1} s(n) \cos(\omega nT) - \gamma_N \sum_{n=0}^{N-1} s(n) \sin(\omega nT)}{\alpha_N \beta_N - \gamma_N^2} \quad (7)$$

where $$\alpha_N = \sum_{n=0}^{N-1} \cos^2(\omega nT)$$

$$\beta_N = \sum_{n=0}^{N-1} \sin^2(\omega nT)$$

$$\gamma_N = \sum_{n=0}^{N-1} \sin(\omega nT)\cos(\omega nT)$$

Using this solution, the respective estimates $A_N$ and $\phi_N$ of the amplitude A and phase $\phi$ can be stated below:

$$A_N = (a_N^2 + b_N^2)^{\frac{1}{2}} \tag{8}$$

$$\phi_N = \tan^{-1}(b_N/a_N) + (1 - \text{sgn}(a_N))\pi \tag{9}$$

The inventor realized that under certain circumstances, the relationship between sample size N and sample frequency $\omega_s$, expressed in equations (6) and (7) could be simplified. Thus by selecting the sample size N such that N=kM where k is a positive integer, the equations (6) and (7) can be reduced as follows:

$$a_N = \frac{2}{kM} \sum_{n=0}^{kM-1} s(n)\sin(\omega nT) \text{ for } k = 1, 2, 3, \ldots \tag{10}$$

$$b_N = \frac{2}{kM} \sum_{n=0}^{kM-1} s(n)\cos(\omega nT) \text{ for } k = 1, 2, 3, \ldots \tag{11}$$

where M denotes the fundamental period of the signal $\sin(2\omega nT)$.

As an example, a sinusoidal signal $\sin(\omega nT + \pi/2)$, with the amplitude of one and phase of $\pi/2$ where $\omega = 2\pi$ radians/second and the sampling interval T=0.25 seconds, is considered. The samples are assumed to contain no noise components so that s(0)=1, s(1)=0, s(2)=−1, s(3)=0, s(4)=1, s(5)=0, s(6)−1, and s(7)=0. Since the fundamental period of the signal $\sin(n\pi/2 + \pi/2)$ is four, the minimum sample size of 2 is included for calculations. The calculation results for the amplitude and phase for each sample size N=2, 3, 4, 5, 6, 7 and 8 are summarized in the table below. For N=2, 4, 6, and 8, the calculations are done through the use of the simplified LSM based on equations 10 and 11 above, while N=3, 5, and 7 are done through the use of the LSM based on equations (6) and (7) above. For each sample size, the exact amplitude and phase are obtained. In the table, * indicates an integer multiple of half the fundamental period of $\sin(n\pi/2 + n/2)$.

| Items | Sample Size N | | | | | | |
|---|---|---|---|---|---|---|---|
| | 2* | 3 | 4* | 5 | 6* | 7 | 8* |
| Amplitude $A_N$ | 1 | 1 | 1 | 1 | 1 | 1 | 1 |
| Phase $\phi_N$ | $\pi/2$ | $\pi/2$ | $\pi/2$ | $\pi/2$ | $\pi/2$ | $\pi/2$ | $\pi/2$ |
| Coefficient $a_N$ | 0 | 0 | 0 | 0 | 0 | 0 | 0 |
| Coefficient $b_N$ | 1 | 1 | 1 | 1 | 1 | 1 | 1 |

As an embodiment of the present invention, a more practical algorithmic implementation of the above technique is used. This implementation uses the simplified LSM and determines automatically the sample size N by updating iteratively the estimates for the amplitude and phase until the spedfled accuracy is obtained. The implementation does not require the sample size to be predetermined as in the case of the LSM and DFT methods. The sample size is automatically determined to optimize the tradeoff between the accuracy and the computational cost, which is quite contrary to the conventional approach.

Referring to FIG. 1, the implementation according to one embodiment consists of initialization and main steps.

Initialization Step

Determine the sampling interval T and let M be the fundamental period of either $\sin(\omega nT)$ or $\sin(2\omega nT)$. Determine the positive values of $\epsilon_a$ and $\epsilon_b$ for the termination criteria, which will be described below. Set an upper limit $N_u$ for the sample size and a lower limit for the apparent signal-to-noise ratio, $ASNR_L$, then set the sample counter n to zero, the fundamental period counter k to one, and the following initialization parameters to zero: $P_T = 0$, $a_N = 0$, and $b_N = 0$.

Main Step

1. Set i=0, $a_i$=0, $b_i$=0 and $P_i$=0
2. Obtain a digitized sample s(n) taken at t=nT and then update the following:

$$a_{i+1} = a_i + s(n)\sin(\omega nT)$$

$$b_{i+1} = b_i + s(n)\cos(\omega nT)$$

$$P_{i+1} = P_i + s(n)^2.$$

If i=M−1, replace i by i+1 and then go to Step 3, otherwise replace i by i+1 and n by n+1, and repeat Step 2.

3. Compute $a_N$, $b_N$, $P_T$, $P_a$, and ASNR as follows:

$$a_N = \frac{k}{k+1}\hat{a}_N + \frac{2}{(k+1)M} a_i$$

$$b_N = \frac{k}{k+1}\hat{b}_N + \frac{2}{(k+1)M} b_i$$

$$P_T = \frac{k}{k+1}\hat{P}_T + \frac{2}{(k+1)M} P_i$$

$$P_a = (a_N^2 + b_N^2)/2$$

$$ASNR = 10 \log \frac{P_a}{P_T - P_a}$$

If neither of the conditions specified below is satisfied, go to Step 4, $$ASNR < ASNR_L$$

$$n \leq N_u$$

otherwise the algorithm is terminated and the solution is readily available.

4. If the following two conditions specified below are satisfied, the algorithm is terminated and the solution is readily available, $$|a_N - \hat{a}_N| < \epsilon_a$$

$$|b_N - \hat{b}_N| < \kappa_b$$

otherwise store $a_N$, $b_N$ and $P_T$ as follows:

$$\hat{a}_N = a_N$$

$$\hat{b}_N = b_N$$

$$\hat{P}_T = P_T$$

then replace k by k+1 and go to Step 1.

In the above algorithm, $P_T$, $P_a$, and ASNR are the total power, the apparent noise power and apparent signal-to-noise ratio respectively and derived as follows. From equation (5) above, the means square error $\epsilon(a_N, b_N)$ is given by:

$$\epsilon(a_N, b_N) = \frac{1}{N} \sum_{n=0}^{N-1} (s(n) - x(n))^2 \qquad (12)$$

$$= \frac{1}{N} \sum_{n=0}^{N-1} (s(n) - a\sin(\omega nT) - b\cos(\omega nT))^2$$

$$= \frac{1}{N} \sum_{n=0}^{N-1} s(n)^2 - A_N^2/2 + ((a - a_N)^2 + (b - b_N)^2)/2$$

In equation (12), the means square error can be thought of as the total noise power which consists of the apparent noise power $P_a$ and the modelling noise power $P_m$ defined below:

$$P_a = \frac{1}{N} \sum_{n=0}^{N-1} s(n)^2 - A_N^2/2$$

$$P_m = ((a - a_N)^2 + (b - b_N)^2)/2$$

The apparent noise power above is obviously the difference between the total power $P_T$ present in the samples and the estimate $P_E$ of the true signal power, and thus:

$$P_T = \frac{1}{N} \sum_{n=0}^{N-1} s(n)^2$$

$$P_E = A_N^2/2$$

The apparent signal-to-noise ratio is defined by:

$$ASNR = 10 \log \frac{P_a}{P_T - P_a}$$

Detection of load coils

The above measurement method is applied to the detection of load coil in the telephone subscriber's loop. The approach is based on the measurement of the driving point impedances (sometimes called input impedances) through the use of predetermined sinusoidal stimulus signals. First the driving point impedances are measured using the stimulus sinusoidal signals at regular intervals over a certain frequency range and are stored for further processing. Subsequently, all the stored impedances are processed to locate possible poles and zeros by calculating magnitude or phase variations over the frequency range.

Figure 2:
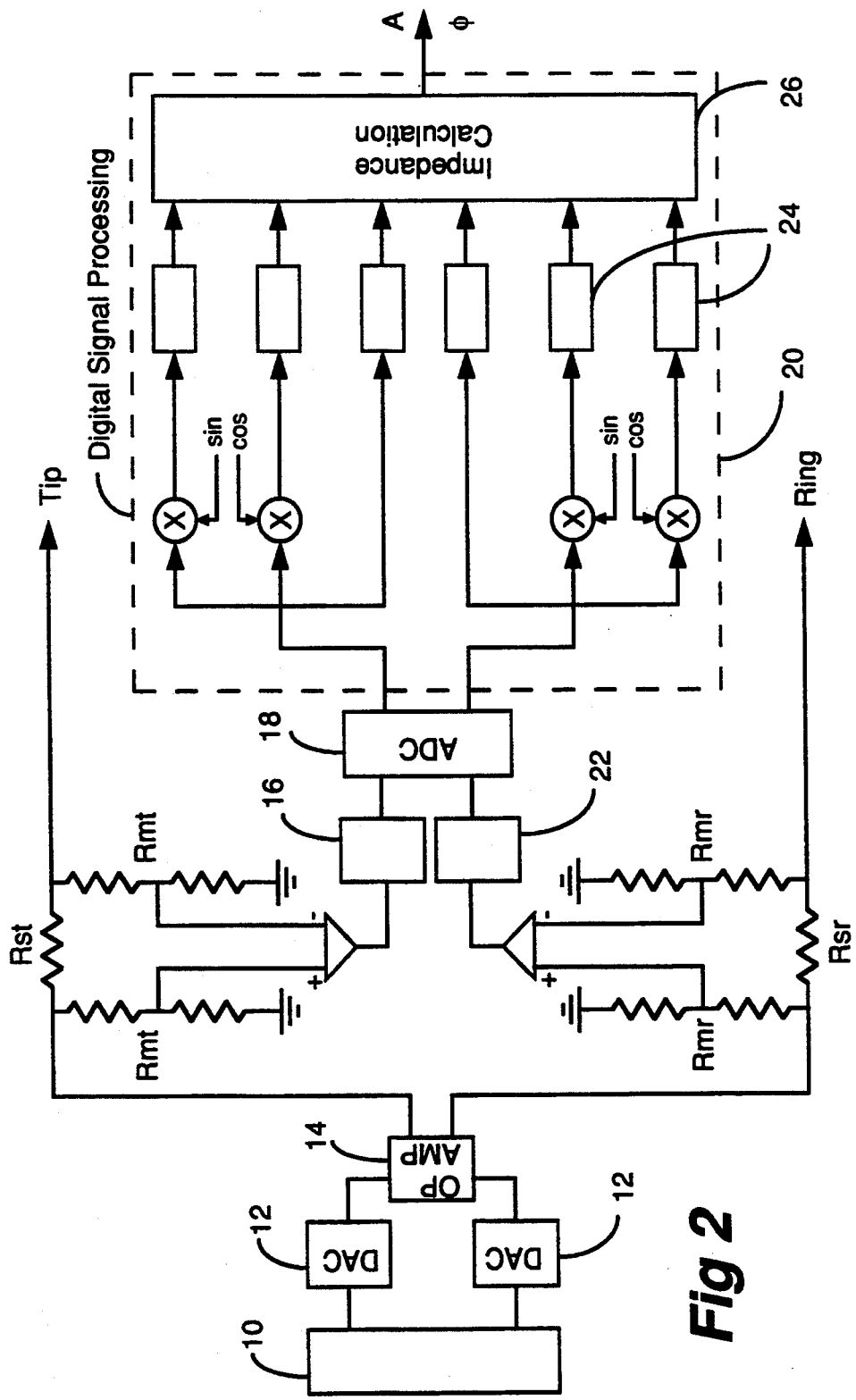
FIG. 2 is a schematic diagram of an apparatus for measuring the phase and amplitude of a sinusoidal signal according to another embodiment of the present invention.

In one of the preferred embodiments, the measurements are performed by using the setup which is schematically illustrated in FIG. 2. The internal tip and ring terminals are connected to the external tip and ring terminal wires. The setup on the ring side is identical to that on the tip side to maintain the balance between tip and ring. A digital signal generator 10 and two digital-to-analog converters 12 produce predetermined sinusoidal stimulus signals in the frequency range of 500 Hz to 4 KHz, in steps of about 500 Hz which are to be used to sweep the tip and ring circuits. An operational amplifier 14 controls the application of the stimulus signals to the tip and ring circuits, as will be described below. On the tip side, a source resistor $R_{st}$ and measuring resistors $R_{mt}$ produce a potential difference proportional to the current which flows through the tip circuit. The potential difference is applied through an analog filter 16 to an analog-to-digital converter 18 whose output is processed and stored at digital signal processing means 20. Like the tip side, the ring side has a source resistor $R_{sr}$ and measuring resistors $R_{mr}$. A potential difference generated at the resistors is fed through an analog filter 22 to the ADC 18. The calculations using sine and cosine functions are schematically shown in the digital signal processing means 20. Two 4 KHz analog filters 16 on the tip and ring sides are used for the frequency range of interest. For each stimulus sinusoidal signal, a sampling frequency is predetermined to guarantee a rational fundamental frequency, thus resulting in the sample size of an integer multiple of the fundamental period. As explained above, this is needed to produce the accuracy in the measurements of the amplitude and phase of the driving point impedances. For each frequency, a lookup table is used to provide corresponding amplitudes for real-time purpose. The lookup table is generated by using the following formula;

$$\sin(2\pi f n/f_s) \text{ for } n = 0, 1, 2, \ldots, \infty$$

where $f_s$ and $f$ are sampling frequency and the stimulus signal frequency, respectively. The size of the lookup table is equal to one cycle or the multiple of one cycle for the above discrete signal, that is, it is equal to the number of data points listed in the table. Since each lookup table contains the amplitude starting from zero to $m-1$ consecutively, the signal can be repeated as long as required where m denotes the number of samples per cycle. The selection of the sampling frequency and stimulus sinusoidal signal frequency is summarized in the table below.

| Stimulus Frequency (Hz) | Number of Samples | Sampling Frequency (Hz) |
|---|---|---|
| 495.958 | 94 | 46620.0466 |
| 1013.479 | 92 | 46620.0466 |
| 1456.876 | 96 | 46620.0466 |
| 2119.093 | 96 | 46620.0466 |
| 2457.003 | 120 | 49140.0500 |
| 3071.250 | 128 | 49140.0500 |
| 3510.004 | 112 | 49140.0500 |
| 4095.004 | 96 | 49140.0500 |

In the embodiment, all three impedances (tip-ring, tip-ground and ring-tip) at a given frequency are obtained by two stage measurements for each stimulus frequency as shown in the table below:

| Stage | Tip Side | Ring Side |
|---|---|---|
| I | 30 Volts Peak | 30 Volts Peak |
| II | 30 Volts Peak | 0 Volts |

The magnitudes of the current in the tip and ring circuits at the two Stages above are obtained by further processing values stored in the buffers 24. Using the measurement results of currents $I_{tp}$ (tip current) and $I_{rp}$ (ring current), where p=1 or 2 and signifies whether the measurement is at Stage I or II, the network value of each impedance is calculated at an impedance calculation means 26 by using the following equations in which $V_{tp}$ and $V_{rp}$ (p=1 or 2) are voltages applied on the tip and ring side respectively at either Stage I or II.

$$Z_{ntr} = \frac{I_{t1}(B_{t2} - B_{r2}) + I_{t2}(B_{t1} - B_{r1}) +}{I_{t1}I_{r2} - I_{r1}I_{t2}}$$

$$Z_{ntg} = \frac{I_{t1}(B_{t2} - B_{r2}) +}{I_{t1}I_{r2} - I_{r1}I_{t2}} + \frac{I_{r1}I_{t2}B_{T1} - I_{t1}I_{r2}B_{r1} +}{(I_{t1}I_{r2} - I_{r1}I_{t2})(I_{t1} + I_{r1})}$$

$$Z_{nrg} = \frac{I_{t1}(B_{t2} - B_{r2}) +}{I_{t1}I_{r2} - I_{r1}I_{t2}} + \frac{I_{r1}I_{t2}B_{t1} - I_{t1}I_{r2}B_{r1} +}{(I_{t1}I_{r2} - I_{r1}I_{t2})(I_{t1} + I_{r1})}$$

where $$B_{t1} = \frac{I_{t1}}{\frac{1}{R_{st}} + \frac{1}{R_{mt}}} - \frac{V_{t1}}{1 + \frac{R_{st}}{R_{mt}}}$$

$$B_{r1} = \frac{I_{r1}}{\frac{1}{R_{sr}} + \frac{1}{R_{mr}}} - \frac{V_{r1}}{1 + \frac{R_{sr}}{R_{mr}}}$$

$$B_{t2} = \frac{I_{t2}}{\frac{1}{R_{st}} + \frac{1}{R_{mt}}} - \frac{V_{t2}}{1 + \frac{R_{st}}{R_{mt}}}$$

$$B_{r2} = \frac{I_{r2}}{\frac{1}{R_{sr}} + \frac{1}{R_{mr}}} - \frac{V_{r2}}{1 + \frac{R_{sr}}{R_{mr}}}$$

The poles and zeros of the driving point impedance can be located in two methods which will be described below, a magnitude-based method and phase-based method.

Magnitude-based method

The magnitude of the driving point impedance over the frequency range of the interest is known to be a nonlinear function of frequency called an impedance function for simplicity.

If the impedance function $|Z(f)|$ is monotonically decreasing over the frequency range of interest, it is highly likely that one pole is located at $f=0$, while one zero is located at $f=\infty$. In this case, of course, no load coils are expected to be present in the subscriber's loop. If the impedance function $|Z(f)|$ is not monotonically decreasing over the frequency range of interest, some poles and zeros are expected in that frequency range. Poles are located by identifying local maximum points while zeros are located by identifying local minimum points. The presence of load coils is expected.

To locate poles and zeros within the frequency range, first the pattern of change in the impedance function is identified by using three contiguous points $(f_1, |Z_1|)$, $(f_2, |Z_2|)$ and $(f_3, |Z_3|)$. If an "increase" is followed by a "decrease", the pole (local maximum point) is expected between frequencies $f_1$ and $f_3$. On the other hand, if a "decrease" is followed by an "increase", the zero (local minimum point) is expected between the frequencies $f_1$ and $f_3$.

To locate more accurately poles and zeros, the following quadratic approximation Q(f) to the impedance $|Z(f)|$ is performed:

$$Q(f) = af^2 + bf + c$$

where a, b, and c are coefficient constants. Using the above three points, the constants are given as follows:

$$a = \frac{|Z_1|(f_3 - f_2) + |Z_2|(f_1 - f_3) + |Z_3|(f_2 - f_1)}{(f_3 - f_2)(f_3 - f_1)(f_2 - f_1)}$$

$$b = -\frac{|Z_1|(f_3^2 - f_2^2) + |Z_2|(f_1^2 - f_3^2) + |Z_3|(f_2^2 - f_1^2)}{(f_3 - f_2)(f_3 - f_1)(f_2 - f_1)}$$

$$c = \frac{|Z_1| f_2 f_3 (f_3 - f_2) + |Z_2| f_1 f_3 (f_1 - f_3) + |Z_3| f_1 f_2 (f_2 - f_1)}{(f_3 - f_2)(f_3 - f_1)(f_2 - f_1)}$$

If $a > 0$, then a local minimum point f is obtained by using the following formula:

$$f = -b/2a$$

This point is considered to be a zero. On the other hand, if $a < 0$, then a local maximum point f is obtained by the same equation above. This point is considered to be a pole.

Phase-base method

The phase-based method uses the phase of the driving point impedances. The driving point impedance $Z_{tr}$ is a complex number so that it can be stated as follows:

$$Z_{tr} = X_{tr} + jY_{tr}, j = \sqrt{-1}$$

where $X_{tr}$ and $Y_{tr}$ denotes respective real and imaginary parts. Thus the phase of the driving point impedance can be stated as shown below.

$$\phi_{tr} = \tan^{-1}(Y_{tr}/X_{tr})$$

The phases measured are sorted in ascending order according to the stimulus sinusoidal frequencies. Then the sign changes (from plus to minus or from minus to plus) of the phases are determined. If there is no sign change at all (all pluses or all minuses), no poles and zeros over the bandwidth of 4 KHz are expected. If a sign change is observed, a pole or zero is expected to exist between the two stimulus frequencies. The table below shows the results of one experiment. In the table, the sign of the phase for the nonloaded loop is not changed at all, that is, remains negative.

| f in Hz | 495.958 | 1013.479 | 1456.876 | 2119.093 | 2457.003 | 3071.250 | 3510.004 | 4095.004 |
|---|---|---|---|---|---|---|---|---|
| Sign of $\phi_{tr}$ | − | − | − | − | − | − | − | − |

However, if the subscriber line contains load coils, the sign of the phase of the driving impedance is changed along with the frequency. This is illustrated in the table below, where two sign changes are seen.

| f in Hz | 495.958 | 1013.479 | 1456.876 | 2119.093 | 2457.003 | 3071.250 | 3510.004 | 4095.004 |
|---|---|---|---|---|---|---|---|---|
| Sign of $\phi_{tr}$ | − | − | + | + | + | − | − | − |

Although the phase-based method requires the accuracy of phase measurement, it provides excellent capability for detecting accurately the presence or absence of poles and zeros in highly noisy environments.

The present invention calibrates automatically the phase of each stimulus signal just before actual impedance measurement is performed. The inaccuracy which may be caused by spectral leakage is reduced because the number of samples are deliberately determined by selecting the best sampling frequency and stimulus signal frequency, using the least mean square method. By selecting these frequencies, and also the sample sizes, the present invention minimizes dependency on other external factors such as the presence of foreign AC and DC components. The present invention can perform the load coil detection test of a normal subscriber's loop within about 5 seconds, thus allowing the method to be applied to the routine test. It should also be noted that the invention does not require measurement setup at the other end of the test point, as compared to other known methods.

What is claimed is:

1. A method of measuring driving point impedances $Z_{tr}$, $Z_{tg}$ and $Z_{rg}$ of a telephone subscriber's loop, where $Z_{tr}$ is the driving point impedance between the tip and ring of said telephone subscriber's loop, $Z_{tg}$ is the driving point impedance between the tip and ground, and $Z_{rg}$ is the driving point impedance between the ring and ground, comprising steps of:

simultaneously applying to said tip and ring a sinusoidal stimulus signal of a predetermined frequency $\omega$;

measuring said sinusoidal stimulus signal which is transmitted through said tip and ring to generate a first pair of respective measured signals;

digitizing said first pair of measured sinusoidal signals to generate a first pair of respective digitized sample signals $s_{t1}(n)$ and $s_{r1}(n)$ where $n=0, 1, 2, \ldots$, by using the sampling period $T=2\pi/\omega_s$, and the sample size $N=kM$ where $\omega_s$ is the sampling frequency, k is a positive integer and M is the fundamental period of $\sin(2\omega nT)$;

multiplying said digitized sample signals $s_{t1}(n)$ and $s_{r1}(n)$ by $\sin(\omega nT)$ and $\cos(\omega nT)$;

applying to either said tip or ring said sinusoidal stimulus signal of said predetermined frequency;

measuring sinusoidal signals which are transmitted through said tip and ring to generate a second pair of respective measured signals;

digitizing said second pair of measured sinusoidal signals to generate a second pair of respective digitized sample signals $s_{t2}(n)$, and $s_{r2}(n)$ where $n=0, 1, 2, \ldots$, by using the sampling period $T=2\pi/\omega_s$, and the sample size $N=kM$;

multiplying said digital sample signals $s_{t2}(n)$, and $s_{r2}(n)$ by $\sin(\omega nT)$ and $\cos(\omega nT)$; and processing all of said multiplied signals to derive the driving point impedances $Z_{tr}$, $Z_{tg}$ and $Z_{rg}$ of said telephone subscriber's loop.

2. The method of measuring driving point impedances according to claim 1, comprising a further step of calculating the amplitude and/or phase of said driving point impedances.

3. A method of detecting the presence of a load coil on a telephone subscriber's loop, comprising steps of:

measuring the driving point impedances thereof according to claim 1 using each of a series of discrete sinusoidal stimulus signals of predetermined frequencies $\omega_i$, $i=1, 2, 3 \ldots, m$; and analyzing changes in said series of driving point impedance obtained above to determine the presence of a load coil.

4. The method according to claim 3, wherein said predetermined frequencies $\omega_i$, $i=1, 2, 3 \ldots, m$, are within a range of 500 Hz to 4,000 Hz.

5. An apparatus for detecting the presence of a load coil on a telephone subscriber's loop by measuring driving point impedances thereof comprising:

a sinusoidal signal generator for generating a plurality of sinusoidal stimulus signals of predetermined discrete frequencies, $\omega_i$, $i=1, 2, 3 \ldots, m$, to be applied to the tip and ring of said telephone subscriber's loop;

measuring means for measuring separately current which flows through said tip and ring to generate respective measured sinusoidal signals;

digitizing means for digitizing said measured sinusoidal signals to generate respective digitized sample signals $s_{ti}(n)$ and $s_{ri}(n)$, where $n=0, 1, 2, \ldots$ and $i=1, 2, 3, \ldots, m$, by using the sampling period $T=2\pi/\omega_s$ and the sample size $N=kM$ where $\omega_s$ is the sampling frequency, k is a positive integer and M is the fundamental period of $\sin(2\omega nT)$; and processing means for processing said digitized sample signals $s_{ti}(n)$, and $s_{ri}(n)$ to derive the driving point impedances of said telephone subscriber's loop for each of said plurality of sinusoidal stimulus signals.

6. An apparatus for detecting the presence of a load coil on a telephone subscriber's loop by measuring driving point impedances thereof, according to claim 5, further comprising switching means for controlling the application of said sinusoidal stimulus signals to said tip and ring simultaneously to obtain driving point impedances at a first stage and to either said tip or ring to obtain driving point impedances at a second stage.

* * * * *